(12) United States Patent
Crescini et al.

(10) Patent No.: US 11,946,964 B2
(45) Date of Patent: Apr. 2, 2024

(54) DUAL-SIDEBAND MICROWAVE INTERFEROMETER

(71) Applicant: International Business Machines Corporation, Armonk, NY (US)

(72) Inventors: Nicolò Crescini, Volargne (IT); Andreas Fuhrer Janett, Zurich (CH); Gian R. von Salis, Aeugst am Albis (CH); Eoin Gerard Kelly, Kilchberg (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 85 days.

(21) Appl. No.: 17/562,391

(22) Filed: Dec. 27, 2021

(65) Prior Publication Data
US 2023/0204647 A1 Jun. 29, 2023

(51) Int. Cl.
*G01R 29/08* (2006.01)
*G06N 10/40* (2022.01)

(52) U.S. Cl.
CPC ......... *G01R 29/0892* (2013.01); *G06N 10/40* (2022.01)

(58) Field of Classification Search
CPC .............................. G01R 29/0892; G06N 10/40
USPC ......................................................... 324/461
See application file for complete search history.

(56) References Cited

U.S. PATENT DOCUMENTS

| 7,015,499 B1 | 3/2006 | Zagoskin |
| 8,169,231 B2 | 5/2012 | Berkley |
| 8,294,138 B2 | 10/2012 | Farinelli et al. |
| 9,589,236 B1 | 3/2017 | Abdo |

(Continued)

FOREIGN PATENT DOCUMENTS

| CN | 110006541 | 7/2019 |
| JP | 2013195219 | 9/2013 |

(Continued)

OTHER PUBLICATIONS

Capmany, Jose, and Carlos R. Fernández-Pousa. "Quantum modelling of electro-optic modulators." Laser & Photonics Reviews 5.6(2011): 750-772. (Year: 2011).*

(Continued)

*Primary Examiner* — Christopher P McAndrew
(74) *Attorney, Agent, or Firm* — Amin, Turocy & Watson, LLP

(57) ABSTRACT

One or more systems, devices and/or methods of use provided herein relate to a device that can facilitate a process to measure a pair of spectral sidebands and suppress one of common mode phase or amplitude noise. A device can comprise an interferometer device that can detect an interference of two spectral sidebands. The interferometer device can comprise a signal circuit that can detect at least one of a phase or an amplitude of a signal resulting from the interference of the two spectral sidebands, an IQ modulator that can generate the two spectral sidebands using a portion of a local oscillator (LO) microwave signal and a pair of signals at a same intermediate frequency, and/or a mixer that can interfere the two spectral sidebands having been output or reflected from a device under test, including mixing the two spectral sidebands with another portion of the LO microwave signal.

24 Claims, 10 Drawing Sheets
(4 of 10 Drawing Sheet(s) Filed in Color)

(56) References Cited

U.S. PATENT DOCUMENTS

| | | | |
|---|---|---|---|
| 10,338,120 B2* | 7/2019 | Chikando | G01S 5/0284 |
| 2018/0180655 A1* | 6/2018 | Kuse | H04B 10/63 |
| 2022/0317170 A1* | 10/2022 | Yook | G01R 27/28 |

FOREIGN PATENT DOCUMENTS

| | | | |
|---|---|---|---|
| JP | 5917218 B2 | 5/2016 | |
| WO | WO-2015113153 A1* | 8/2015 | G01R 1/073 |
| WO | 2020112185 | 6/2020 | |
| WO | 2021077041 | 4/2021 | |

OTHER PUBLICATIONS

Siahmakoun, Azad, Sergio Granieri, and Kenneth Johnson. "Double- and single-sideband suppressed-carrier optical modulator implemented at 1320 nm using LiNbO3 crystals and bulk optics." Optoelectronic and Wireless Data Management, Processing, Storage, and Retrieval. vol. 4534. SPIE, 2001. (Year: 2001).*

Zou, Xinhai, et al. "Microwave photonic harmonic down-conversion based on cascaded four-wave mixing in a semiconductor optical amplifier." IEEE Photonics Journal 10.1 (2018): 1-8. (Year: 2018).*

Mell et al., "The NIST Definition of Cloud Computing," Recommendations of the National Institute of Standards and Technology, NIST Special Publication 800-145, Sep. 2011, 7 pages.

Chapman et al., "Single-sideband modulator for frequency domain multiplexing of superconducting qubit readout," arXiv:1703.01693v2 [quant-ph] May 24, 2017, 11 pages.

Lindstrom et al., "Pound-locking for characterization of superconducting microresonators," Rev. Sci. Instrum. 82, 104706 (2011), arXiv:1106.5396v3 [physics.ins-det], 5 pages.

Horne et al., "Heterodyne Laser Frequency Modulation Spectroscopy With Automatic Phase Correction," An IP.com Prior Art Database Technical Disclosure, IP.com No. IPCOM000099605D, IP.com Electronic Publication Date: Mar. 15, 2005, 3 pages.

* cited by examiner

DUAL-SIDEBAND MICROWAVE INTERFEROMETER

FIELD OF THE INVENTION

The present disclosure relates to interferometry of microwave signals, and more specifically to interferometry of microwave signals for use with a quantum system for quantum computing.

BACKGROUND

In quantum computing systems, radio frequency signals can be used to probe states of qubits. The inventors have observed that existing approaches involving measurement readout of such radio frequency signals can be subject to systematic noise. One or more approaches described herein can provide one or more ways of working with radio frequency signals that can address such shortcoming and/or one or more other shortcomings of existing approaches.

SUMMARY

The following presents a summary to provide a basic understanding of one or more embodiments described herein. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate a process to measure a pair of sidebands and suppress one of common mode phase or amplitude noise. In the quantum computing space, one or more embodiments described herein can facilitate a process to measure a qubit state or parity of a pair of qubits.

In accordance with an embodiment, a device can comprise an interferometer device that detects an interference of two spectral sidebands.

In accordance with another embodiment, a system can comprise a processor, a chip controlled by the processor, and an interferometer device coupled to the chip, wherein the interferometer device detects an interference of two spectral sidebands.

In one or more embodiments of the system, the processor can be a quantum processor and the chip can be a quantum chip controlled by the quantum processor. An advantage of this can be allowing for quantum limited readout of relative phase or amplitude changes between two devices attached to a same transmission line but at a resonant frequency corresponding to the two sidebands, which can be used to directly measure parity of two qubits.

In accordance with yet another embodiment, a method can comprise detecting an interference of two spectral sidebands with an interferometer device.

An advantage of the aforementioned device, system and/or method can be employing the sidebands to suppress one of common mode phase or amplitude noise and/or employing the sidebands to detect a measurement relative to a reference (e.g., one of the sidebands). That is relative frequency shifts between resonances/resonators or other devices on test can be detected. Indeed, interferometric measurements taken can be generally insensitive to common systematic uncertainties, e.g., phase and transmission fluctuations, affecting gigahertz (GHz) frequency measurements. In quantum space, this can be used to measure parity of two qubits, for example.

In one or more embodiments of the aforementioned device, system and/or method, the two spectral sidebands can comprise a first sideband that has been at least partially absorbed or phase-shifted and reflected or transmitted by a test device and a second sideband that has been reflected off or transmitted by the test device without being absorbed or phase-shifted by the test device. An advantage can be an ability to detect and employ the second sideband as a reference to a measurement obtained from detecting and analyzing the first sideband. The first sideband can be partially absorbed and/or phase-shifted In one or more embodiments of the aforementioned device, system and/or method, the interferometer device can comprise a digital signal circuit that detects one of a phase or an amplitude of one of the two spectral sidebands and references the detected phase or amplitude against the other of the two sidebands. An advantage can be building resiliency into measurement/readout operations, leading to less decoherence of other quantum devices, such as superconducting qubits.

In one or more embodiments of the aforementioned device, system and/or method, the interferometer device can comprise an IQ modulator that generates the two spectral sidebands using a local oscillator (LO) microwave signal and a pair of signals at a same intermediate frequency. Additionally, and/or alternatively, the two spectral sidebands can be generated with individually controllable relative phases and amplitudes. An advantage of this can be that one sideband can be affected by a device under test, while a second sideband can be reflected off or transmitted by the device under test, allowing for a relative difference measurement to be determined.

In one or more embodiments of the aforementioned device, system and/or method, the interferometer device can comprise a mixer that mixes the two sidebands with a local oscillator (LO) microwave signal and thereby interferes the two sidebands having been transmitted through or reflected off a device under test. An advantage of this can be that the mixer can down convert a signal, comprising the two sidebands, from the device under test and suppress a common mode noise in the phase or amplitude of the signal.

In one or more embodiments of the aforementioned device, system and/or method, the interferometer device can receive the two spectral sidebands from a device under test, where the device under test is a resonator. Further, the two spectral sidebands can be received during measurement readout of a state of a qubit by the resonator. An advantage of this can be ability to obtain measurement readout of one or more states of one or more qubits while employing the sidebands to suppress one of common mode phase or amplitude noise.

DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
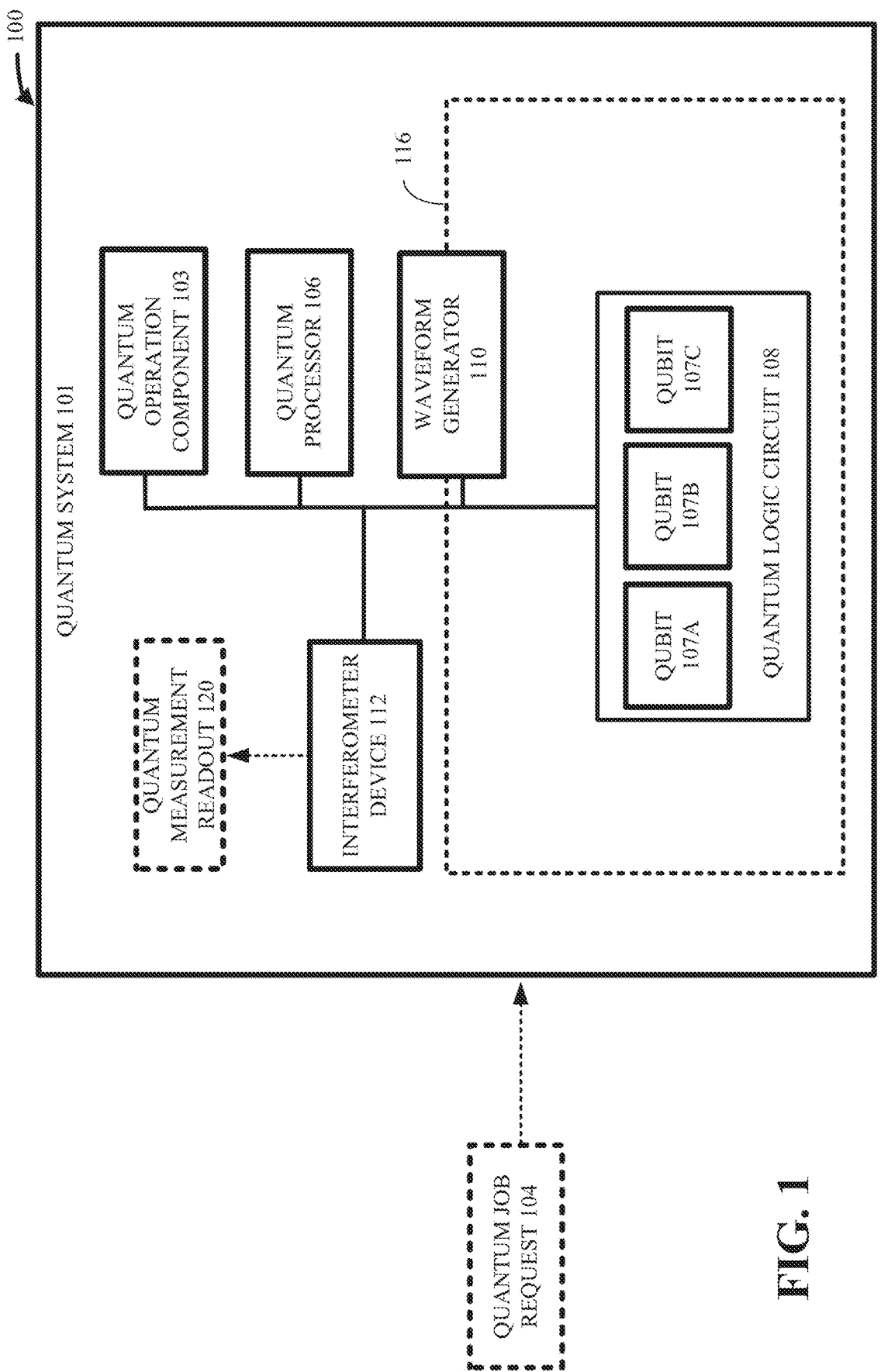
FIG. 1 illustrates a block diagram of an example, non-limiting system that can facilitate measurement readout from one or more qubits, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. However, in various cases, that the one or more embodiments can be practiced without these specific details.

In current interferometer technologies, reflectometry can be performed using a single sideband, leaving the signal sensitive to common mode phase noise and/or amplitude noise. Accordingly, it can be difficult to determine origin of observed noise with noise measurements. Likewise, such reflectometers can be sensitive to frequency shifts but lack access or sensitivity to quality factor (e.g., dissipation) of a device under test (DUT), such as a resonator. In the quantum space, existing readout radio frequency (RF) electronics for qubits likewise can employ only single sideband measurements that can be subject to systematic noise. This systematic noise can affect the measurement readout and/or can affect other components of a related quantum system, such as the real-world, physical qubit coherence.

Further, measuring phase shifts and/or amplitude changes of microwave signals of a device under test according to existing techniques can provide one or more challenges. Single sideband detection can be sensitive to common mode phase-noise and amplitude noise. It can be difficult to determine an origin of an observed noise for noise measurements. Relative to a pound-locking technique, the setup can be complex, can employ non-standard microwave components, and thus can result in limiting bandwidth access. Further, the device can be sensitive only to frequency shifts, without having access to a quality factor (e.g., dissipation) of a device under test, such as a resonator.

In the quantum space, and/or in other spaces, such as microwave domains, it can be desirable to selectively suppress common mode phase noise or amplitude noise to allow for fast and efficient measurement readout from a device under test (DUT). It can be desirable to have simultaneous access to both resonance frequency and quality factor (e.g., dissipation) variations of a DUT. In the quantum space, such DUT can be a resonator, that is sensing one or more qubits of a multi-qubit system. That is, in the quantum space, it can be desirable to have simultaneous access to both resonance frequency and quality factor (e.g., dissipation) variations of a measured resonator.

For example, quantum computation utilizes a qubit as its essential unit instead of a classical computing bit. A qubit (e.g., quantum binary digit) is a quantum-mechanical analog of a classical bit. Whereas classical bits can employ only one of two basis states (e.g., 0 or 1), qubits can employ superpositions of those basis states (e.g., $\alpha|0\rangle+\beta|1\rangle$, where $\alpha$ and $\beta$ are complex scalars (such that $|\alpha|^2+|\beta|^2=1$), allowing several qubits to theoretically hold exponentially more information than the same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, or similar binary-type state measure. Qubits, partaking of the laws of quantum mechanics, can occupy a superposition of 0 and 1 states. It is not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1.

Indeed, general quantum programs can employ coordination of quantum and classical parts of a computation. One way to contemplate general quantum programs is to identify processes and abstractions involved in specifying a quantum algorithm, transforming the algorithm into executable form, running an experiment or simulation, and analyzing the results. A notion throughout these processes is use of intermediate representations. An intermediate representation (IR) of computation is neither its source language description nor target machine instructions, but something in between. Compilers can utilize several IRs during a process of translating and optimizing a program. An input is a source code describing a quantum algorithm and compile time parameter(s). An output is a combined quantum/classical program expressed using a high-level IR. A distinction between quantum and classical computers is that the quantum computer is probabilistic, thus measurements of algorithmic outputs provide a proper solution within an algorithm specific confidence interval. Computation is repeated until a satisfactory probable certainty of solution can be achieved.

By processing information using laws of quantum mechanics, quantum computers can offer novel ways to perform computation tasks such as molecular calculations, optical photons, optimization, and many more. Many algorithms and system components can be introduced to perform such computational tasks efficiently.

One or more embodiments described herein relate to facilitating a process to measure a pair of spectral sidebands, also referred to herein as sidebands, and to suppress one of common mode phase or amplitude noise. In the quantum computing space, one or more embodiments described herein can facilitate a process to measure a qubit state or parity of a pair of qubits. For example, mixing on-chip with an interferometer device described herein can allow for quantum limited readout of relative phase or amplitude changes (e.g., minor and/or relatively small changes) between two devices attached to a same transmission line but at a resonant frequency corresponding to the two sideband tones employed by the interferometer device, which can be used to directly measure parity of two qubits.

That is, one or more embodiments described herein relate to measurement readout, such as in the quantum space, although applicability is also relative to the microwave domain and/or other spaces/domains. Employing an interferometer device as described herein, selective general immunity to phase and/or transmission (e.g., amplitude) noise can be provided, allowing for the simultaneous access to resonance frequency and quality factor variations of a measured resonator. This can build resiliency into measurement/readout operations.

For example, use of the interferometer device(s) described herein can aid microwave, quantum and/or other setups affected by systematic fluctuations and drifts, such as from environment temperature, cable temperature, cable length, cable imperfections, and/or fluctuations in attenuation when sweeping microwave power. Indeed, in one or more embodiments, high signal-to-noise ratio (SNR) at low probing power of a DUT, e.g., resonator, can lead to fast, non-perturbative measurements, allowing an entity to track interaction of two-level systems (TLS) with resonators, such as in real-time. TLS, which also can be referred to as two-level fluctuators, can be defects in dielectrics that can lead to noise in superconducting resonators and decoherence in superconducting qubits.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. However, in various cases, that the one or more embodiments can be practiced without these specific details.

Generally, the subject computer processing system(s), methods, apparatuses, devices and/or computer program products can be employed to solve new problems that can arise through advancements in technology, computer networks, the Internet and the like.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIG. 1 and/or with other figures described herein.

Turning first generally to FIG. 1, one or more embodiments described herein can include one or more devices, systems and/or apparatuses that can facilitate executing one or more operations to facilitate output of one or more state and/or readout results. FIG. 1 illustrates a block diagram of an example, non-limiting system 100 that facilitate operation of a quantum circuit and readout of a quantum state by employed two spectral sidebands, such as by employing an interference of the two spectral sidebands. However, in one or more other embodiments, the non-limiting system 100 can be a non-quantum system, such as a microwave system.

The quantum system 101 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

In one or more embodiments, the quantum system 101 can comprise one or more quantum components, such as a quantum operation component 103, a quantum processor 106, quantum readout/control electronics such as including an interferometer device 112, a waveform generator 110, and/or a quantum logic circuit 108 comprising one or more qubits (e.g., qubits 107A, 107B and/or 107C), also referred to herein as qubit devices 107A, 107B and 107C.

The quantum processor 106 can be any suitable processor. The quantum processor 106 can generate one or more instructions for controlling the one or more processes of the quantum operation component 103 and/or for controlling the quantum logic circuit 108 and/or waveform generator 110.

The quantum operation component 103 can obtain (e.g., download, receive, search for and/or the like) a quantum job request 104 requesting execution of one or more quantum programs. The quantum operation component 103 can determine one or more quantum logic circuits, such as the quantum logic circuit 108, for executing the quantum program. The request 104 can be provided in any suitable format, such as a text format, binary format and/or another suitable format. In one or more embodiments, the request 104 can be received by a component other than a component of the quantum system 101, such as a by a component of a classical system coupled to and/or in communication with the quantum system 101.

The waveform generator 110 can perform one or more quantum processes, calculations and/or measurements for operating one or more quantum circuits on the one or more qubits 107A, 107B and/or 107C. For example, the waveform generator 110 can operate one or more qubit effectors, such as qubit oscillators, harmonic oscillators, pulse generators and/or the like to cause one or more pulses to stimulate and/or manipulate the state(s) of the one or more qubits 107A, 107B and/or 107C comprised by the quantum system 101. That is, the waveform generator 110, such as in combination with the quantum processor 106, can execute operation of a quantum logic circuit on one or more qubits of the circuit (e.g., qubit 107A, 107B and/or 107C). In response, the quantum operation component 103 can output one or more quantum job results, such as one or more quantum measurements 120, in response to the quantum job request 104.

The quantum logic circuit 108 and a portion or all of the waveform generator 110 can be contained in a cryogenic environment, such as generated by a cryogenic chamber 116, such as a dilution refrigerator. Indeed, a signal can be generated by the waveform generator 110 within the cryogenic chamber 116 to effect the one or more qubits 107A-C. Where qubits 107A, 107B and 107C are superconducting qubits, cryogenic temperatures, such as about 4K or lower can be employed to facilitate function of these physical qubits. Accordingly, the elements of the quantum measurement circuit 120 also are to be constructed to perform at such cryogenic temperatures.

The interferometer device can be any suitable components for performing readout of one or more measurements, such as relative to one or more states and/or one or more frequencies, such as resonant frequencies, of one or more qubits of the quantum logic circuit 108. That is, the interferometer device 112 can provide the quantum measurement readout 120. As will be described in further detail below, in the quantum space, the interferometer device 112, can suppress a phase or amplitude noise of a signal from a resonator for reading out from one or more qubits. The interferometer device 112 can be selectively switched to suppress one of the phase or amplitude noise, or the other.

The interferometer device 112 further can provide simultaneous access to resonance frequency and quality factor variations of a measured resonator. By building in resiliency to systematic noise, the interferometer device 112 can allow for stable and fast readout from a device under test (DUT) such as a resonator.

The interferometer device 112 can be controlled by any suitable component of the quantum system 101, such as by the processor 106. For example, such control can allow for selective tuning of the sideband frequency corresponding to a readout resonator frequency, and/or tuning of one or more relative phases and/or amplitudes to provide desired noise suppression.

In one or more embodiments, the interferometer device 112 can be located at least partially, or fully, within a cryogenic environment, such as provided by the cryogenic chamber 116.

In one or more embodiments, the interferometer device 112 can be connected between the quantum processor 106 and the readout/control electronics 109.

The following/aforementioned description(s) refer(s) to the operation of a single quantum program from a single quantum job request. This operation can include one or more readouts from cryogenic environment electronics within cryogenic chamber 116 by room temperature control/readout electronics external to the cryogenic chamber 116. That is, one or more of the processes described herein can be scalable, also such as including additionally, and/or alternatively, execution of one or more quantum programs and/or quantum job requests in parallel with one another. Scalability of efficient readout can be enabled by employing interferometer devices 112 in quantity for various resonators of a quantum system.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function in combination with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Figure 2:
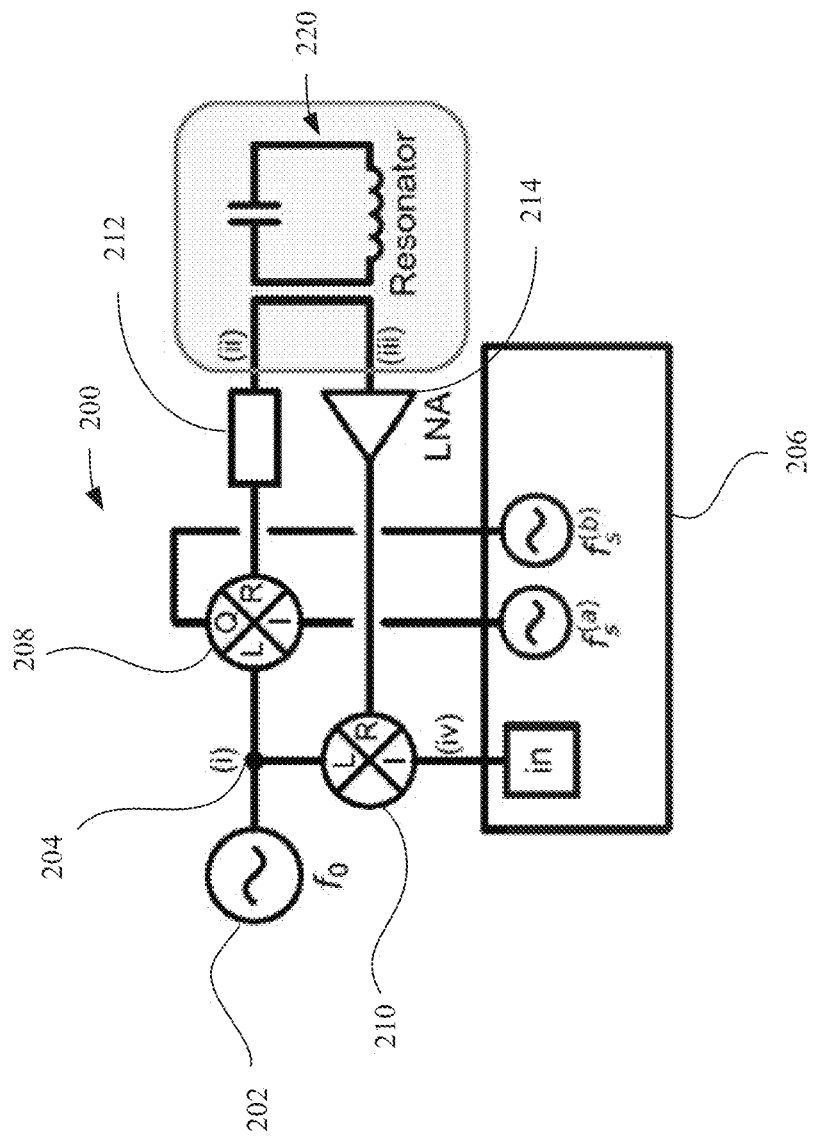
FIG. 2 illustrates a schematic diagram of an example interferometer device, in accordance with one or more embodiments described herein.

FIG. 2 illustrates a block diagram of an example non-limiting interferometer device 200 (also herein referred to as a device) that can be employed as the interferometer device 112 of the quantum system 101 of the non-limiting system 100 of FIG. 1. Repetitive description of like elements employed in one or more embodiments described herein is omitted for sake of brevity.

Generally, the interferometer device 200 can employ a pair of signals $f_s(a)$ and $f_s(b)$ at a same intermediate frequency and a local oscillator (LO) microwave signal (e.g., from i) to generate and mix (e.g., at two different stages) a pair of sidebands. The pair of sidebands can be transmitted off and/or reflected from a device under test (DUT) (e.g., at ii and iii), such as a resonator, and acquired and detected by a signal processing circuit, such as an analog-to digital converter (ADC) device in combination with a signal processor (e.g., lock in amplifier device). Further, using only the output of the signal processing circuit, the two sideband tones can be balanced.

In a quantum system, the interferometer device 200 can be employed for the control and/or readout of one or more superconducting qubits, such as 1 to about 10 qubits and/or such as about 1 to about 5 qubits, relative to a common resonator, for example. On-quantum-chip-mixing can allow for quantum limited readout of relative phase or amplitude changes between two devices attached to same transmission line but at a resonant frequency corresponding to the two sideband tones. That is, relative frequency shifts between resonances/resonators can be measured, which can be used to measure parity of a pair of qubits, for example, by employing a reference signal, e.g., one of the two sidebands that is reflected from the DUT (e.g., resonator).

Turning now in particular to the device illustrated at FIG. 2, the interferometer device 200 can comprise a local oscillator (LO) 202, a splitter 204, a signal processing circuit 206, an IQ modulator (also herein referred to as an IQ mixer) 208, a frequency mixer (also herein referred to as a mixer) 210, an attenuator 212 and a low-noise amplifier (LNA) 214). These components can operate to communicate one or more signals to a device under test (DUT) 220 (also herein referred to as a test device), such as the resonator illustrated at FIG. 2. It is noted that an attenuator 212 and a low-noise amplifier 214 can be omitted where the device under test is not at cryogenic temperatures.

In use, a single local oscillator (LO) microwave signal (also herein referred to as an LO microwave tone), such as at the frequency $f_0$ can be split into two, such as by the splitter 204 (at i). The two portions of the LO signal can both be the same. A first portion of the LO microwave signal can be modulated with the two signals $f_s(a)$ and $f_s(b)$ using the IQ mixer 208, to generate a pair of sidebands, such as an upper sideband and a lower sideband (also herein referred to as sideband tones). That is the, two sidebands can differ in frequency.

In one or more embodiments, the spectral sidebands can be generated separately by separate IQ mixers, using respective phase references signals, for example.

The modulation can include mixing the two signals $f_s(a)$ and $f_s(b)$ that are at the same intermediate frequency (IF) with the LO microwave signal, which signals can be thereby tuned in amplitude and/or phase. Via the modulation, the LO microwave signal transmission can be minimized.

The two phase-stable microwave source signals $f_s(a)$ and $f_s(b)$ can be provided by the signal processing circuit 206 at the same intermediate frequency (IF). In one or more other embodiments, the signals $f_s(a)$ and $f_s(b)$ can be provided by another device. Although relative to the illustrated embodiment of the interferometer device 200, the two sidebands (e.g., generated by the IQ mixer 208) can be balanced employing an output of the signal processing circuit 206.

The output of the IQ mixer 208 can be sent to the DUT 220, such as a resonator, with suitable attenuation and amplification, such as provided by the attenuator 212 and LNA 214. It is noted that the suitable attenuation and amplification can be omitted where the DUT 220 is not at cryogenic temperature. That is, the output of the IQ mixer 208, comprising the two microwave sidebands (e.g., sideband tones), can be employed to probe the DUT 220. Only one sideband interacts with the DUT 220, with the other sideband being reflected off the DUT 220. That is, the other sideband does not see the DUT 220. Put another way, the output sidebands can comprise a first sideband that has been partially absorbed and subsequently reflected by the DUT 220 and a second sideband that has been reflected off the DUT 220 without being absorbed by the DUT 220. The absorption and reflection can occur at least partially concurrently. An advantage can be an ability to detect and employ the second sideband as a reference to a measurement obtained from detecting and analyzing the first sideband.

An output signal from the DUT 220, comprising the reflected sideband and the affected sideband, can be acquired by the frequency mixer 210. At the frequency mixer 210, the output signal can be down-converted by mixing the output signal with the LO microwave signal from the splitter (e.g., the second portion of the same LO microwave signal as the first portion employed by the IQ mixer 208). That is, the two sideband tones from the DUT 220 can be interfered and mixed at a second stage. Output from the frequency mixer 210 can be dependent upon one or more parameters, such as phase and amplitude of the two IF sources (the two phase-stable microwave source signals $f_s(a)$ and $f_s(b)$), relative phase between the LO microwave signals at the mixers 208 and 210, and/or the like.

As a result of the mixing at the frequency mixer 210, a common mode noise of phase or amplitude of the output signal from the DUT 220 can be suppressed. The frequency mixer 210 can down convert the signals by the LO frequency, giving an output signal that is proportional to the relative difference in phase and amplitude of the two sidebands, as described by Equation 1 provided below. As the signal that is obtained is proportional to a difference in phase or amplitude, any common noise that changes either the phases and/or amplitudes of both sidebands will not lead to a change in the obtained signal, therefore leading to common mode noise insensitivity.

Further, the down-converted signal from the frequency mixer 210 can be acquired by the signal processing circuit 206, lock-in amplifier, ADC or other signal processing circuit or electronics. That is, the signal processing circuit 206 can detect the pair of sidebands, such as an interference of the pair of sidebands. In one or more embodiments, the pair of sidebands can be detected at least partially and/or fully concurrently with one another.

In one or more embodiments, a signal delay can be added between the two spectral sidebands after interaction with the DUT and before down conversion by mixing with the LO. Though, the non-consecutive interacted sidebands cannot experience a same common noise, which can limit common noise resilience.

That is, the signal processing circuit 206 can be employed to detect phase and amplitude of the down-converted signal, such as relative to the phase or amplitude of the other of the two sidebands (reflected sideband). This measurement can be provided fast, with high accuracy, accounting for systematic fluctuations and drifts, and while providing less decoherence to other devices connected to the interferometer device 200. Indeed, the signal processing circuit 206 can be utilized to balance the sidebands while suppressing certain types of systematic noise.

Figure 3:
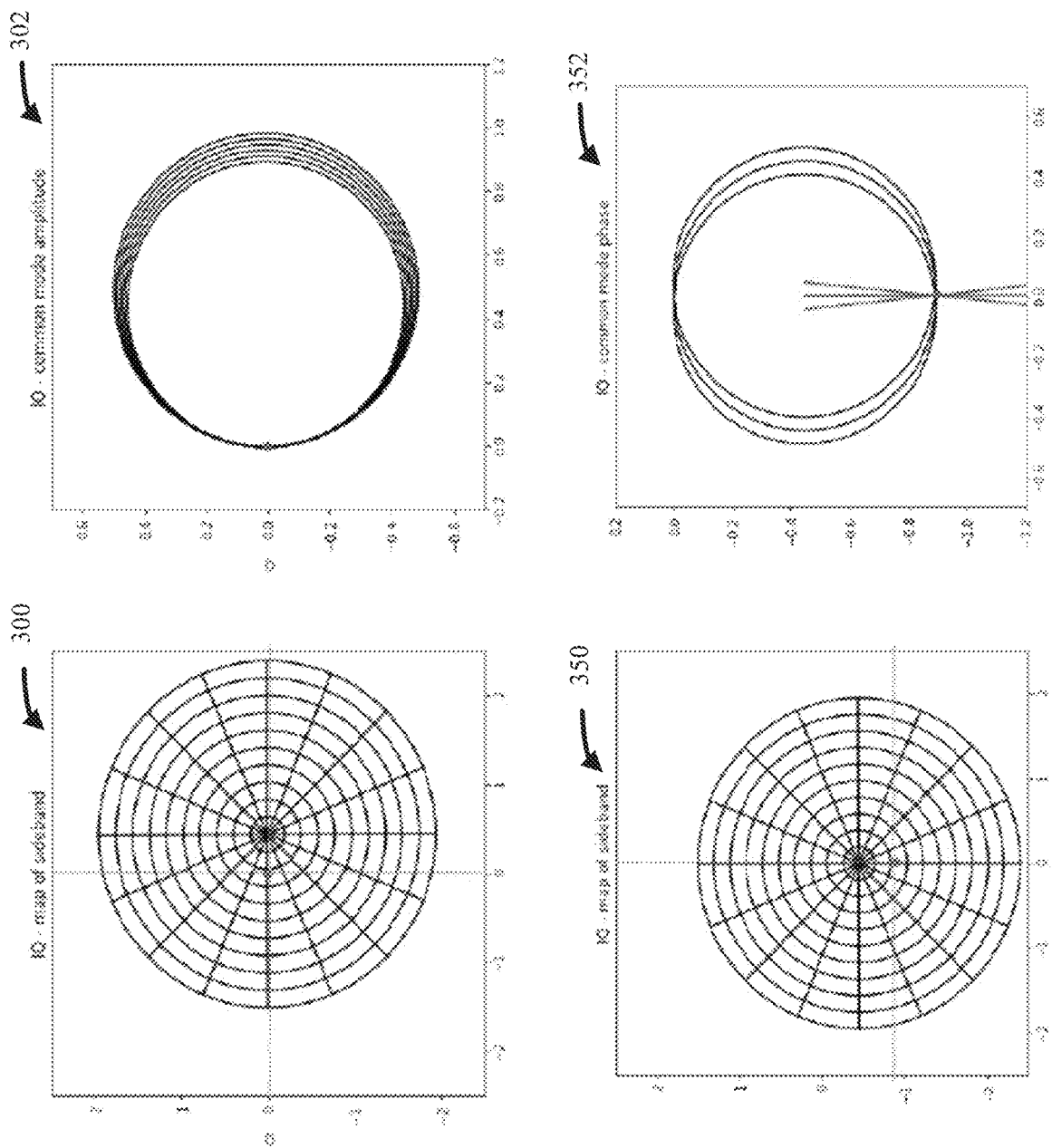
FIG. 3 illustrates a set of graphs mapped in the IQ plane and showing relative amplitude and relative phase, relative to the interferometer device of FIG. 2, and in accordance with one or more embodiments described herein.

Turning now to FIG. 3, exemplary graphs are illustrated relative to readout of resonant frequency shifts and quality factors of niobium nitride (NbN) resonators at milli-Kelvin (mK) temperatures. A device similar to the interferometer device 200, and in accordance with the one or more embodiments described herein, was employed.

In implementation, the two IF tones can be represented by:

$$I = A\cos(\omega t + \theta)$$

$$Q = B\sin(\omega t + \gamma)$$

In the expressions above, t is the time, and A and B are the amplitudes, θ and γ the individual phases and co the (common) angular frequency of the two IF tones. The I and Q can be mixed with the LO (LO microwave signal), e g, cos($\omega_{LO} t$). The term $\omega_{LO}$ describes the angular frequency of the LO microwave signal. The mixed signal consists of two sidebands and can be reflected off the DUT, where one sideband ($W_{LO} + \omega$) can experience a phase shift E and an amplitude attenuation c, such as due to the presence of a resonator of the DUT. The phase shift and amplitude attenuation of that sideband are relative to the phase shift and amplitude attenuation experienced by the other sideband. The reflected signal from the DUT can be mixed again with the LO, at a relative phase shift δ, displaying four interfering terms, as shown below at Equation 1:

$$A\cos((\omega t+\theta+\delta)+B\cos(\omega t+\gamma+\delta)+cA\cos(\omega t+\theta-\delta+\varepsilon)-cB\cos(\omega t+\gamma-\delta+\varepsilon).$$

For suppressed amplitude noise in Equation 1, the equation has to be set to zero, which can be achieved by selecting suitable phases and amplitudes of the two IF tones (θ, γ, A, B). For suppressed common-mode phase noise, Equation 2, provided below, applies, and relative phase shift δ of the LO at the second mixer can be tuned.

$$\cos(\theta-\gamma)=-\frac{1-c^2}{1+c^2}\frac{A^2+B^2}{2AB} \quad \text{Equation 2}$$

Figure 4:
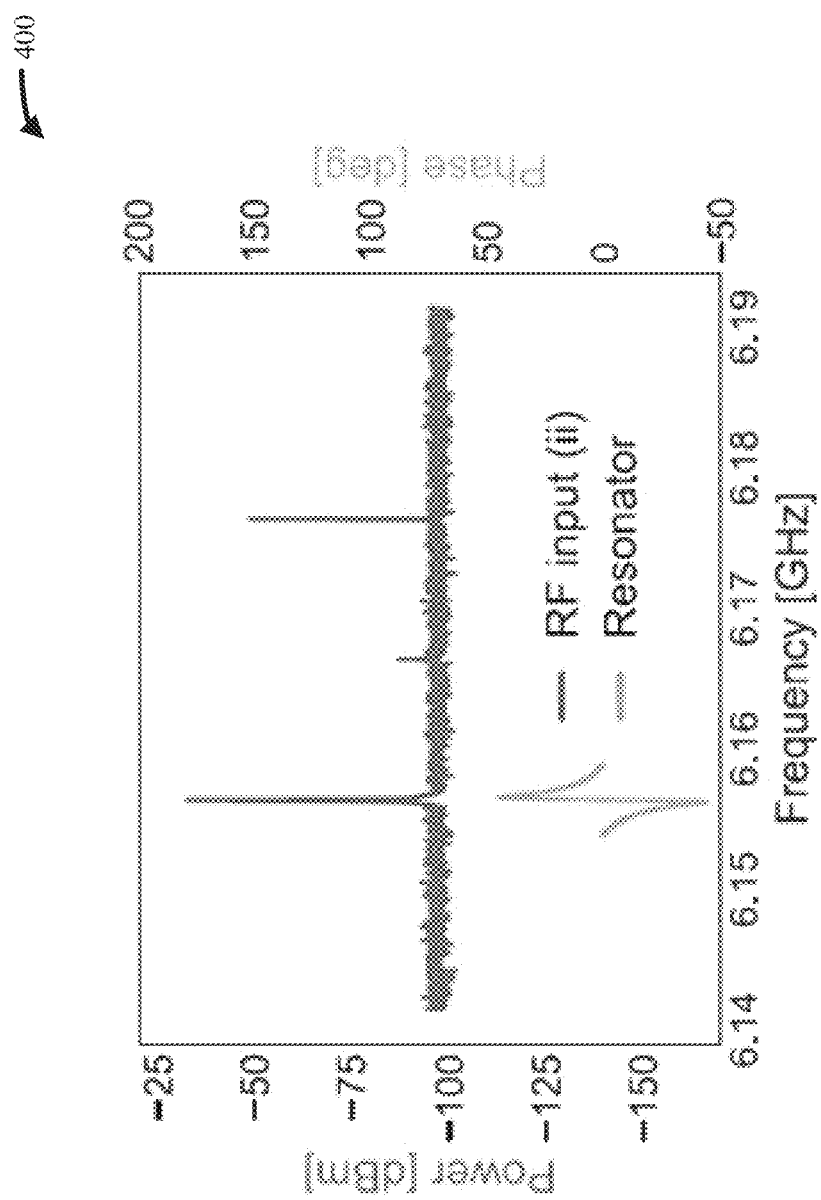
FIG. 4 illustrates a graph showing frequency versus phase and versus power, relative to the interferometer device of FIG. 2, and in accordance with one or more embodiments described herein.

For example, by adjusting the electrical delay (i) and L input of (iv) in FIG. 4, the second mixer can be tuned. This can be accomplished with a phase shifter or by simply adjusting the cable length (i) and L input.

At FIG. 3, multiple maps of relative amplitude c and relative phase E are illustrated in the IQ plane of the down-converted IQ signal from the second mixer.

At graphs 300 and 302 of FIG. 3, operation points are optimized for amplitude reduction. Optimization is chosen for a relative amplitude c of 0.23, shown in graphs 300 and 302 as single points (e.g., dots).

At graph 300, the concentric circles represent positions in the IQ plane of the down-converted signal where the relative amplitude c is fixed at values between 0.1 and 1.0 in steps of 0.1. The lines represent positions where the relative phase epsilon is fixed at values that are at positions of 1.1 plus integer multiples of π/8.

At graph 302, common mode noise reduction for the varying amplitude is shown. The circles in graph 302 show six values of common mode amplitude noise of 0%, 2%, 4%, 6%, 8% and 10% of the nominal amplitude of the signals, respectively. As can be seen from graph 302, the down converted signal is not affected in its amplitude at the optimized position of c=0.23 and epsilon=1.1.

At graphs 350 and 352 of FIG. 3, operation points are optimized for phase noise reduction. Optimization is chosen for a relative phase epsilon of 1.1, shown in graphs 350 and 352 as single points (e.g., dots).

At graph 350, the concentric circles represent positions in the IQ plane of the down-converted signal where the relative amplitude c is fixed at values between 0.1 and 1.0 in steps of 0.1. The lines represent positions where the relative phase epsilon is fixed at values that are at positions of 1.1 plus integer multiples of π/8.

At graph 352, common mode noise reduction for the varying phase is shown. The circles and lines in graph 352 correspond to three different common mode phase noises of size −0.1, 0 and 0.1 radians. The circles show different relative phases Ɛ for c=0.23, the lines different relative amplitudes c for Ɛ =1.1.

Looking now to FIG. 4, the illustrated graph demonstrates optimization and test of probing of the DUT and reference signals. The plot 400 demonstrates the carrier (faint signal at the center) and the two sidebands at either side of the carrier. The left signal (probe) is at the resonator frequency, and can measure shifts, while the right sideband is the reference arm (e.g., reflected sideband) of the interferometer device. The reflected and down-converted signal can depend on the relative phase and amplitude between probe and reference. For example, as shown, the probe sideband has higher power, as the probe sideband is absorbed and attenuated by the resonator itself. At the output, these sidebands will have the same power and interfere destructively. A signal can arise in the case of a change in the resonator's parameters.

For example, plot 400 illustrates the two spectral sidebands with a frequency of +/−10 MHz on each side of the LO (the small peak in the center of the green curve). The two sidebands here are not configured to be exactly the same amplitude or phase and a small part of the LO signal leaks through the IQ modulator (this does not affect the proposed scheme). The resonator curve shows schematically a transmission phase measurement of a hanger resonator (lambda/2 resonator capacitively coupled to a transmission line). It indicates schematically that one sideband can be affected by this resonance and any fluctuations whereas the second sideband is far detuned and thus independent of the resonator.

Figure 5:
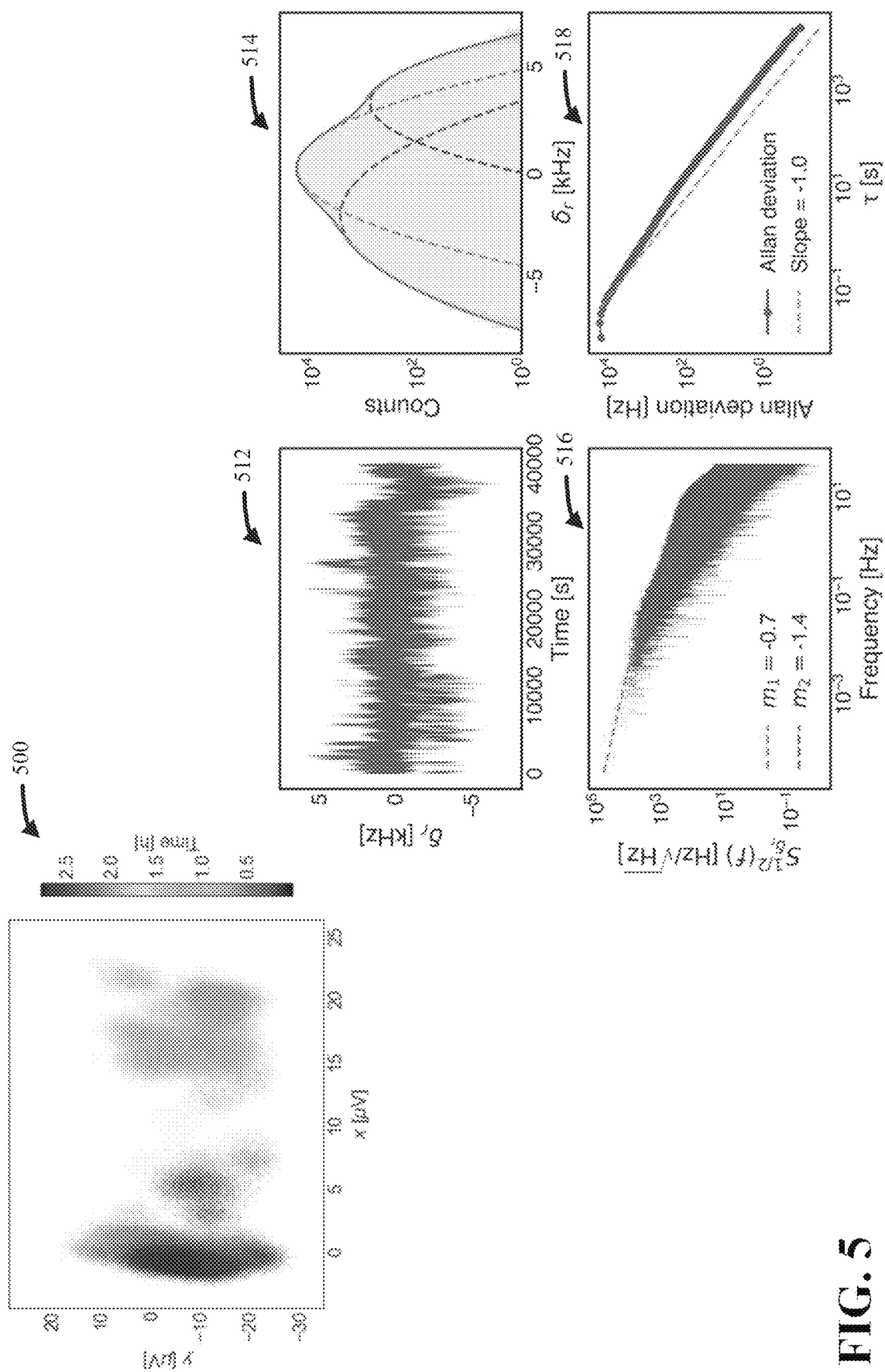
FIG. 5 illustrates a set of graphs illustrating exemplary phase and amplitude noise, relative to the interferometer device of FIG. 2, and in accordance with one or more embodiments described herein.

Turning now to FIG. 5, test data was obtained for an exemplary interferometer device, in accordance with the one or more embodiments described herein. Phase shifts and quality factor variations were simultaneously measured. That is, as generally illustrated at the plots of FIG. 5, phase shifts and quality factor variations can be correlated, allowing for distinguishing between dephasing and loss of coherence.

Plot 500 illustrates a density plot of frequency and quality factor changes as a function of time. That is, plot 500 provides an example of a use case of an interferometer device in accordance with the one or more embodiments described herein. Plot 500 demonstrates how both the quality factor and frequency of one resonator can change over a timescale of 2.5 hours. This technique was used to show that resonator dissipation and dispersion was not continuous but jumped around to certain points in the XY plane, which are hypothesized to correspond to the interaction of the resonator with specific two level fluctuators and the switching on and off of these interactions over the measurement timescale.

Graphs 512, 514, 516 and 518 generally illustrate measured niobium nitride (NbN) resonator noise, comprised of white noise and telegraph signals. Long term stability is greater than with existing techniques.

Graph 512 illustrates a time trace of frequency noise. That is, graph 512 depicts relative change of the resonance frequency of a resonator as a function of time, tracked with the interferometer set up.

Graph 514 illustrates a histogram plot of the graph 512 with a fit to three Lorentzian line shapes. For example, graph 514 provides a histogram of the measurements from graph 512 fitted with three different Gaussian curves indicating that the resonator frequency jumps or switches in a telegraph noise fashion between these different frequencies and fluctuates around these different frequencies with noise corresponding to the deviation of these Gaussian curves.

Graph 516 illustrates a power spectral density graph of noise in graph 512 with a two-slope fit. For example, graph 516 depicts frequency noise spectral density as a function of frequency, which is a Fourier transform of graph 512 normalized over the measurement bandwidth, showing that noise spectral density can be measured with this technique.

Graph 518 illustrates an Allan deviation of the data provided at graph 512. That is, graph 518 depicts an Allan deviation determined from the time trace obtained in graph 512, which Allan deviation is a measure of frequency stability of an oscillator over different timescales.

Together these plots and graphs illustrate that simultaneously measured phase shift and quality factor variation can be correlated, allowing for distinguishing between dephasing and loss of coherence of measurement at the resonator.

Figure 6:
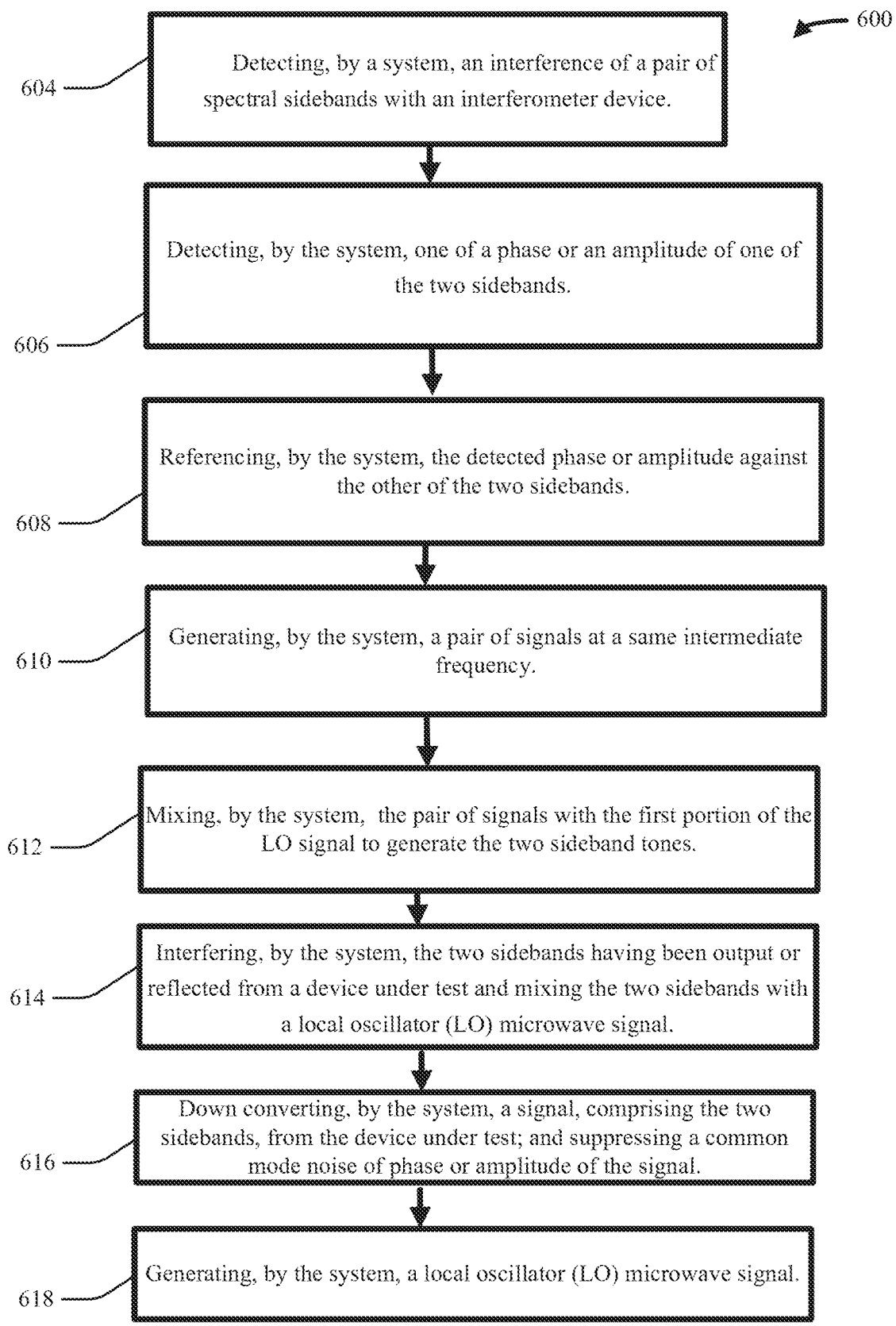
FIG. 6 illustrates a flow diagram of an example use of an interferometer device to facilitate a process to measure a pair of sidebands and suppress one of common mode phase or amplitude noise, non-limiting method that can facilitate use of a device, in accordance with one or more embodiments described herein.
Figure 7:
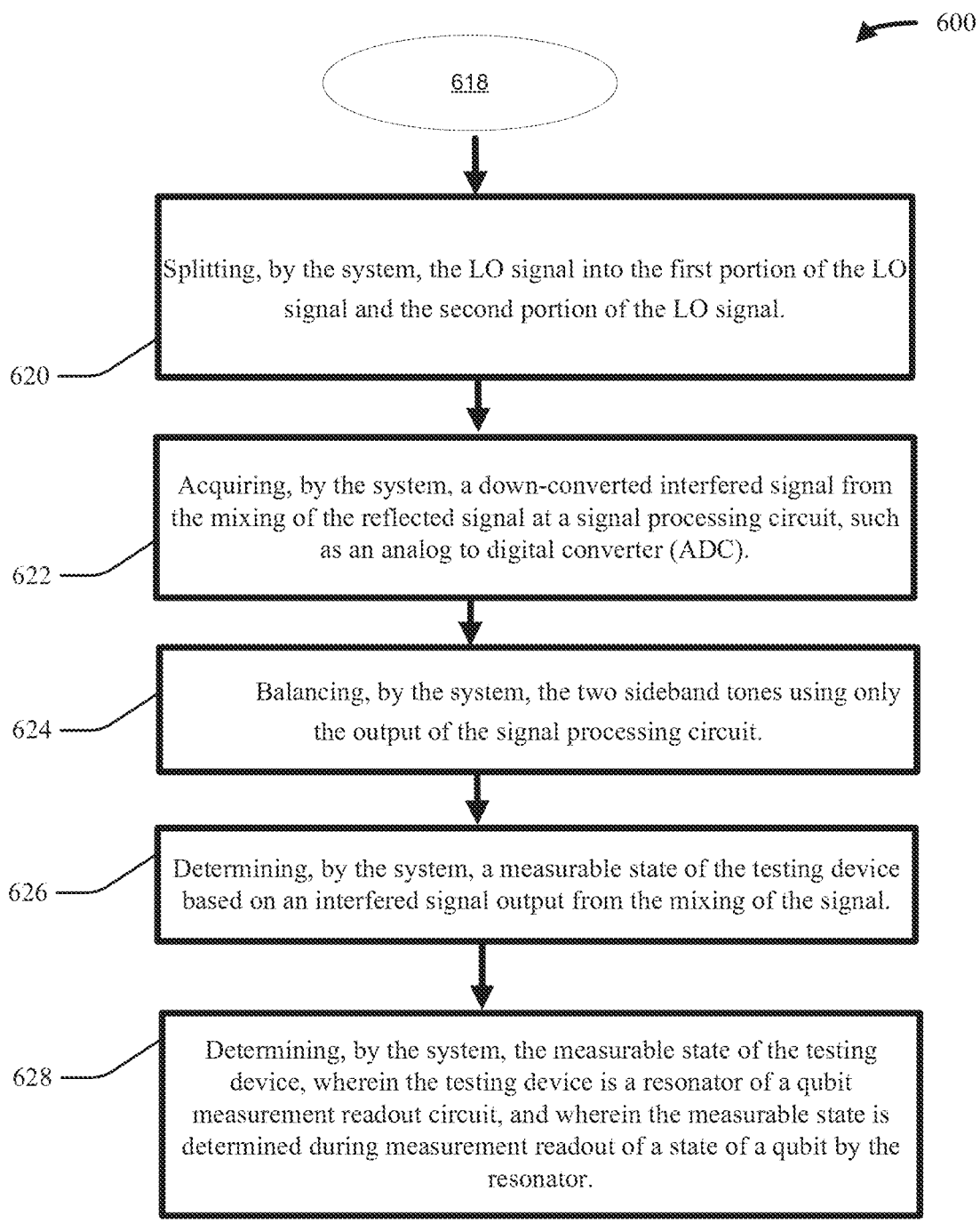
FIG. 7 illustrates a flow diagram of a continuation of the flow diagram of FIG. 6, of an example use of an interferometer device to facilitate a process to measure a pair of sidebands and suppress one of common mode phase or amplitude noise, non-limiting method that can facilitate use of a device, in accordance with one or more embodiments described herein.

Next, FIGS. 6 and 7 illustrate a flow diagram of an example, non-limiting method 600 that can facilitate a process to measure a pair of sidebands and suppress one of common mode phase or amplitude noise, such as the interferometer device 200 of FIG. 2. While the non-limiting method 600 is described relative to the interferometer device 200 of FIG. 2, the non-limiting method 600 can be applicable also to other systems and/or devices described herein, such as the interferometer device 112 of FIG. 1. As shown at FIGS. 6 and 7, the operations at FIG. 7 continue from the operations at FIG. 6. Repetitive description of like elements and/or processes employed in respective embodiments is omitted for sake of brevity.

At 604, the non-limiting method 600 can comprise detecting, by a system, (e.g., quantum system 101) interference a pair of spectral sidebands with an interferometer device (e.g., interferometer device 112, 200).

At 606, the non-limiting method 600 can comprise detecting, by the system (e.g., interferometer device 112, 200), at least one of a phase or an amplitude of one of the two sidebands.

At 608, the non-limiting method 600 can comprise referencing, by the system (e.g., interferometer device 112, 200), the detected phase or amplitude against the other of the two sidebands.

At 610, the non-limiting method 600 can comprise generating, by the system (e.g., interferometer device 112, 200), a pair of signals at a same intermediate frequency.

At 612, the non-limiting method 600 can comprise mixing, by the system (e.g., interferometer device 112, 200), the pair of signals with the first portion of the LO signal to generate the two sideband tones.

At 614, the non-limiting method 600 can comprise interfering, by the system (e.g., interferometer device 112, 200), the two sidebands having been output or reflected from a device under test and mixing the two sidebands with a local oscillator (LO) microwave signal.

At 616, the non-limiting method 600 can comprise down converting, by the system (e.g., interferometer device 112, 200), a signal, comprising the two sidebands, from the device under test; and suppressing a common mode noise of phase or amplitude of the signal.

At 618, the non-limiting method 600 can comprise generating, by the system (e.g., interferometer device 112, 200), a local oscillator (LO) microwave signal.

At 620, the non-limiting method 600 can comprise splitting, by the system (e.g., interferometer device 112, 200), the LO signal into the first portion of the LO signal and the second portion of the LO signal.

At 622, the non-limiting method 600 can comprise acquiring, by the system (e.g., interferometer device 112, 200), a down-converted interfered signal from the mixing of the reflected signal at a signal processing circuit, such as an analog to digital converter (ADC).

At 624, the non-limiting method 600 can comprise balancing, by the system (e.g., interferometer device 112, 200), the two sideband tones using only the output of the signal processing circuit.

At 626, the non-limiting method 600 can comprise determining, by the system (e.g., interferometer device 112, 200), a measurable state of the testing device based on an interfered signal output from the mixing of the signal.

At 628, the non-limiting method 600 can comprise determining, by the system (e.g., interferometer device 112, 200), a measurable state of the testing device, wherein the testing device is a resonator of a qubit measurement readout circuit, and wherein the measurable state is determined during measurement readout of a state of a qubit by the resonator.

For simplicity of explanation, the computer-implemented and non-computer-implemented methodologies provided herein are depicted and/or described as a series of acts. The subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

In summary, one or more systems, devices and/or methods of use provided herein relate to a device that can facilitate a process to measure a pair of sidebands and suppress one of common mode phase or amplitude noise. A device can comprise an interferometer device 112, 200 that can detect two sidebands. The interferometer device 112, 200 can comprise a digital signal circuit 206 that can detect one of a phase or an amplitude of one of the two sidebands and that can reference the detected phase or amplitude against the other of the two sidebands, an IQ modulator 208 that can generate the two sidebands using a local oscillator (LO) microwave signal and a pair of signals at a same intermediate frequency, and/or a mixer 210 that can interfere the two sidebands having been output or reflected from a device under test and that can mix the two sidebands with a local oscillator (LO) microwave signal.

An advantage of the aforementioned device, system and/or method can be employing the sidebands to suppress one of common mode phase or amplitude noise and/or employing the sidebands to detect a measurement relative to a reference (e.g., one of the sidebands). An advantage of this can be that one sideband can be affected by a device under test, while a second sideband can be reflected off the device under test, allowing for a reference to be made during measurement. This can be further facilitated by down converting a signal, comprising the two sidebands, from the device under test and suppress a common mode noise of phase or amplitude of the signal.

That is relative frequency shifts between resonances/resonators or other devices on test can be detected. Indeed, interferometric measurements taken can be generally insensitive to common systematic uncertainties, e.g., phase and transmission fluctuations, affecting gigahertz (GHz) frequency measurements. In quantum space, this can be used to measure parity of two qubits, for example. That is, another advantage can be allowing for quantum limited readout of relative phase or amplitude changes between two devices attached to a same transmission line but at a resonant frequency corresponding to the two sidebands.

Employing an interferometer device as described herein, selective general immunity to phase and/or transmission (e.g., amplitude) noise can be provided, allowing for the simultaneous access to resonance frequency and quality factor variations of a measured resonator. This can, by building resiliency into measurement/readout operations, lead to less decoherence of other quantum devices, such as superconducting qubits.

In one or more embodiments, high signal-to-noise ratio (SNR) at low probing power of a DUT can lead to fast, non-perturbative measurements, allowing an entity to track interaction of TLS with resonators, such as in real-time.

In one or more embodiments, an interferometer device as described herein can operate at roughly 1 hertz (Hz) per sqrt (Hz), such as with a probing power of about 1000 photons.

In one or more embodiments, an interferometer device as described herein can be stable for long integration times, such as days. Stable devices with long term stability over the timescale of days can be desirable for use with one or more quantum systems where, for example, qubit frequency drifts can occur over long timescales (e.g., hours, days) due to 1/f noise. This drift can lead to a desire for re-calibration. Accordingly, it can be desirable to be able to characterize and measure with high stability, otherwise re-calibration can be undesirably performed without purpose.

Indeed, in view of the one or more embodiments described herein, a practical application of the devices described herein can be ability to simultaneously access resonance frequency and quality factor variations of a measured resonator or other device under test. Using the interferometer device, on of a common mode phase noise or amplitude noise from the resonator or other device under test can be suppressed. During readout of a qubit measurement, suppressed noise can aid in less decoherence of other quantum devices, such as the real-world, physical qubit. This is a useful and practical application of computers, especially in view reduction of noise and/or other deleterious backaction effects on reducing decoherence of employed qubits, and thus facilitating enhanced (e.g., improved and/or optimized) operation of the employed qubits. These enhancements can include increased accuracy of quantum results and/or increased availability of the employed qubits. Overall, such computerized tools can constitute a concrete and tangible technical improvement in the field of quantum computing.

Furthermore, one or more embodiments described herein can be employed in a real-world system based on the disclosed teachings. For example, one or more embodiments described herein can function within a quantum system that can receive as input a quantum job request and can measure a real-world qubit state of one or more qubits, such as superconducting qubits, of the quantum system. For example, an interferometer device described herein can suppress common mode phase or amplitude noise to aid in readout from and/or relative to a quantum processor, and thus from the one or more qubits.

Moreover, a device and/or method described herein can be implemented in one or more domains, such as quantum domains, to enable scaled quantum program executions. Indeed, use of a device as described herein can be scalable, such as where a device described herein can be employed in quantity to measure resonances from a plurality of qubits or strings of qubits of a multi-qubit system. Thus, increased scaling of qubits provided in a cryogenic chamber can be enabled with less concern for decoherence due to readout noise or other deleterious effects.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, provide program and/or program instruction execution, such as relative to control of in band and out of band frequencies, as compared to existing systems and/or techniques. Systems, computer-implemented methods and/or computer program products facilitating performance of these processes are of great utility in the field of quantum computing and superconducting quantum systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively detect a pair of sidebands (e.g., sideband tones) as the one or more embodiments described herein can facilitate this process. And, neither can the human mind nor a human with pen and paper detect a pair of sidebands, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 8:
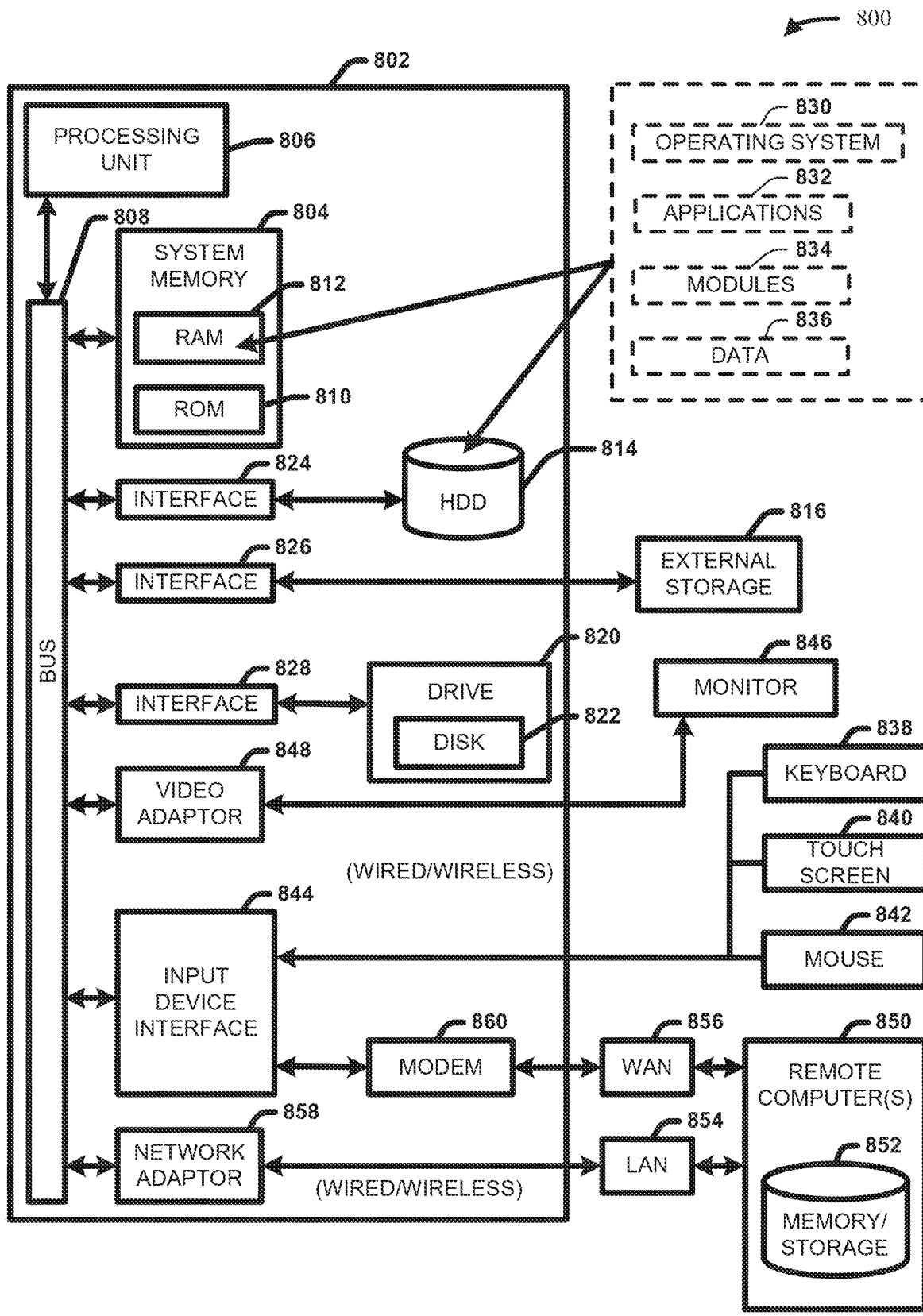
FIG. 8 illustrates a block diagram of an example, non-limiting, operating environment in which one or more embodiments described herein can be facilitated.
Figure 9:
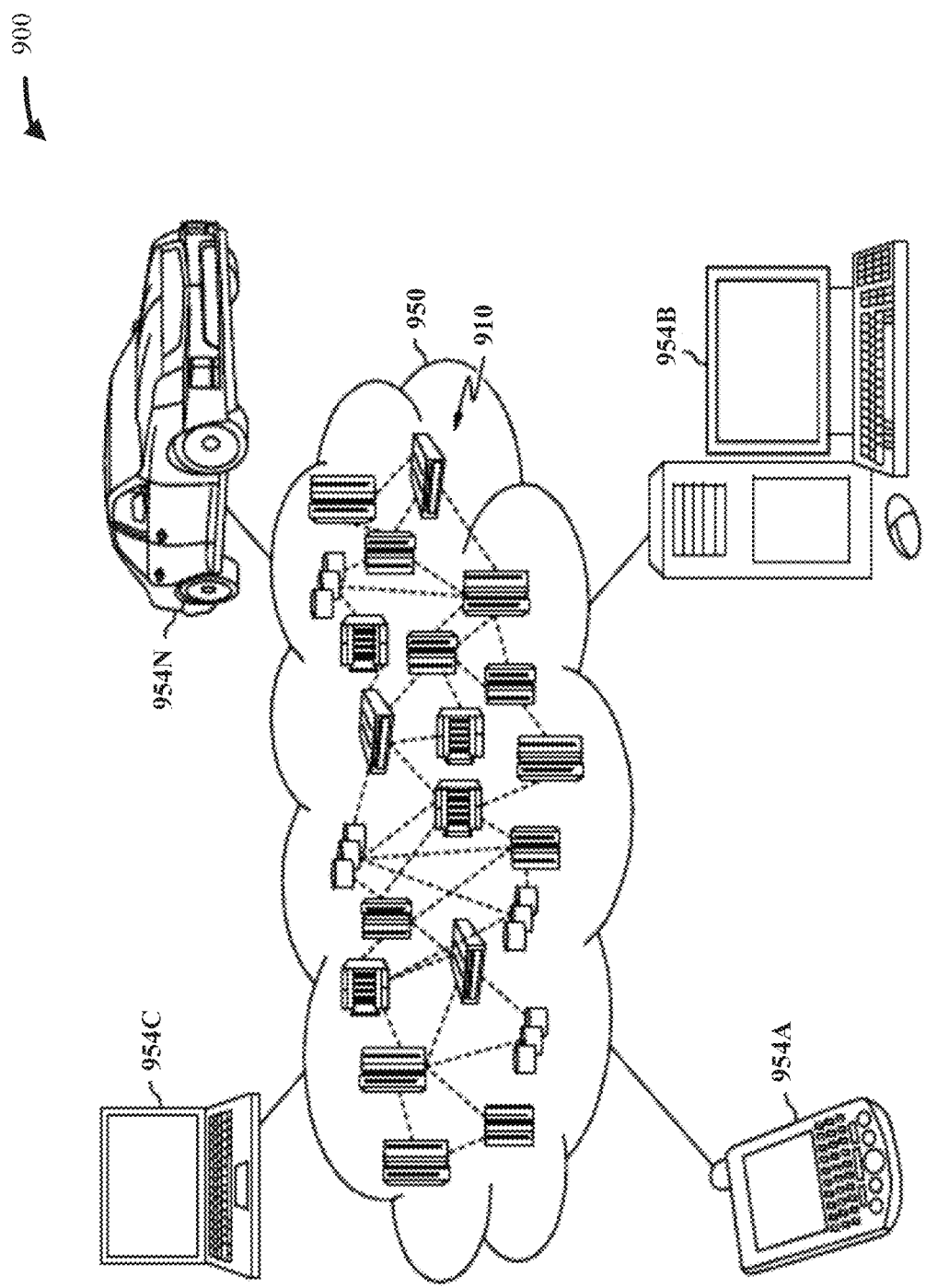
FIG. 9 illustrates a block diagram of an example, non-limiting, cloud computing environment in accordance with one or more embodiments described herein.
Figure 10:
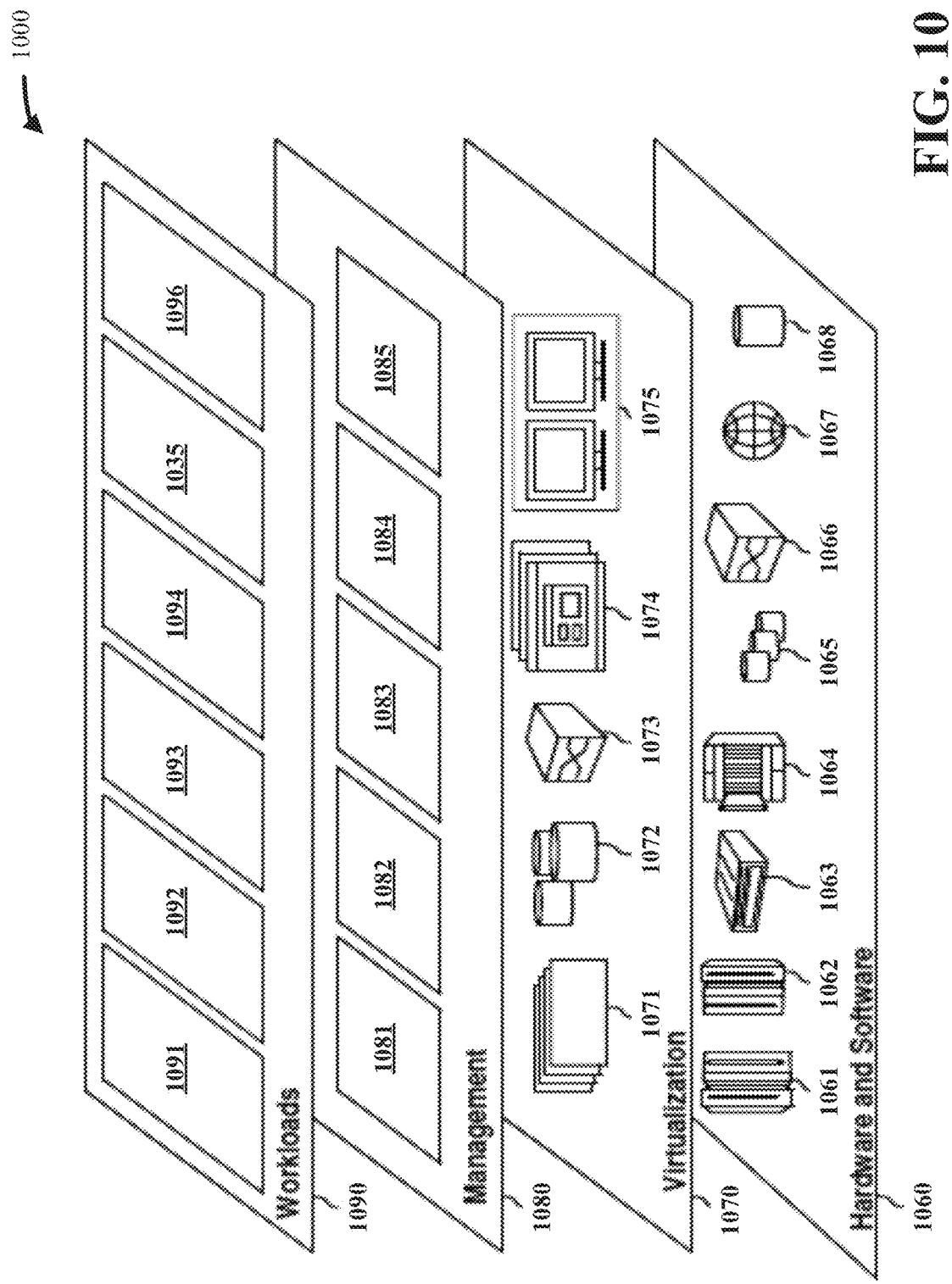
FIG. 10 illustrates a block diagram of example, non-limiting, abstraction model layers in accordance with one or more embodiments described herein.

Turning next to FIGS. 8-10, a detailed description is provided of additional context for the one or more embodiments described herein at FIGS. 1-7.

FIG. 8 and the following discussion are intended to provide a brief, general description of a suitable operating environment 800 in which one or more embodiments described herein at FIGS. 1-7 can be implemented. For example, one or more components and/or other aspects of embodiments described herein can be implemented in or be associated with, such as accessible via, the operating environment 800. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the inventive methods can be practiced with other computer system configurations, including single-processor or multiprocessor computer systems, mini-computers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 8, the example operating environment 800 for implementing one or more embodiments of the aspects described herein can include a computer 802, the computer 802 including a processing unit 806, a system memory 804 and/or a system bus 808. One or more aspects of the processing unit 806 can be applied to processors such as 106 of the non-limiting system 100. The processing unit 806 can be implemented in combination with and/or alternatively to processors such as 106.

Memory 804 can store one or more computer and/or machine readable, writable and/or executable components and/or instructions that, when executed by processing unit 806 (e.g., a classical processor, a quantum processor and/or like processor), can facilitate performance of operations defined by the executable component(s) and/or instruction (s). For example, memory 804 can store computer and/or machine readable, writable and/or executable components and/or instructions that, when executed by processing unit 806, can facilitate execution of the one or more functions described herein relating to non-limiting system 100, as described herein with or without reference to the one or more figures of the one or more embodiments.

Memory 804 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 806 can comprise one or more types of processors and/or electronic circuitry (e.g., a classical processor, a quantum processor and/or like processor) that can implement one or more computer and/or machine readable, writable and/or executable components and/or instructions that can be stored at memory 804. For example, processing unit 806 can perform one or more operations that can be specified by computer and/or machine readable, writable and/or executable components and/or instructions including, but not limited to, logic, control, input/output (I/O), arithmetic and/or the like. In one or more embodiments, processing unit 806 can be any of one or more commercially available processors. In one or more embodiments, processing unit 806 can comprise one or more central processing unit, multi-core processor, microprocessor, dual microprocessors, microcontroller, System on a Chip (SOC), array processor, vector processor, quantum processor and/or another type of processor. The examples of processing unit 806 can be employed to implement one or more embodiments described herein.

The system bus 808 can couple system components including, but not limited to, the system memory 804 to the processing unit 806. The system bus 808 can comprise one or more types of bus structure that can further interconnect to a memory bus (with or without a memory controller), a peripheral bus and/or a local bus using one or more of a variety of commercially available bus architectures. The system memory 804 can include ROM 810 and/or RAM 812. A basic input/output system (BIOS) can be stored in a non-volatile memory such as ROM, erasable programmable read only memory (EPROM) and/or EEPROM, which BIOS contains the basic routines that help to transfer information among elements within the computer 802, such as during startup. The RAM 812 can include a high-speed RAM, such as static RAM for caching data.

The computer 802 can include an internal hard disk drive (HDD) 814 (e.g., EIDE, SATA), one or more external storage devices 816 (e.g., a magnetic floppy disk drive (FDD), a memory stick or flash drive reader, a memory card reader and/or the like) and/or a drive 820, e.g., such as a solid state drive or an optical disk drive, which can read or write from a disk 822, such as a CD-ROM disc, a DVD, a BD and/or the like. Additionally, and/or alternatively, where a solid state drive is involved, disk 822 could not be included, unless separate. While the internal HDD 814 is illustrated as located within the computer 802, the internal HDD 814 can also be configured for external use in a suitable chassis (not shown). Additionally, while not shown in operating environment 800, a solid state drive (SSD) can be used in addition to, or in place of, an HDD 814. The HDD 814, external storage device(s) 816 and drive 820 can be connected to the system bus 808 by an HDD interface 824, an external storage interface 826 and a drive interface 828, respectively. The HDD interface 824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 812, including an operating system 830, one or more applications 832, other program modules 834 and/or program data 836. All or portions of the operating system, applications, modules and/or data can also be cached in the RAM 812. The systems and/or methods described herein can be implemented utilizing one or more commercially available operating systems and/or combinations of operating systems.

Computer 802 can optionally comprise emulation technologies. For example, a hypervisor (not shown) or other intermediary can emulate a hardware environment for operating system 830, and the emulated hardware can optionally be different from the hardware illustrated in FIG. 8. In a related embodiment, operating system 830 can comprise one virtual machine (VM) of multiple VMs hosted at computer 802. Furthermore, operating system 830 can provide runtime environments, such as the JAVA runtime environment or the .NET framework, for applications 832. Runtime environments are consistent execution environments that can allow applications 832 to run on any operating system that includes the runtime environment. Similarly, operating system 830 can support containers, and applications 832 can be in the form of containers, which are lightweight, standalone, executable packages of software that include, e.g., code, runtime, system tools, system libraries and/or settings for an application.

Further, computer 802 can be enabled with a security module, such as a trusted processing module (TPM). For instance, with a TPM, boot components hash next in time boot components and wait for a match of results to secured values before loading a next boot component. This process can take place at any layer in the code execution stack of computer 802, e.g., applied at application execution level and/or at operating system (OS) kernel level, thereby enabling security at any level of code execution.

An entity can enter and/or transmit commands and/or information into the computer 802 through one or more wired/wireless input devices, e.g., a keyboard 838, a touch screen 840 and/or a pointing device, such as a mouse 842. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be connected to the processing unit 806 through an input device interface 844 that can be coupled to the system bus 808, but can be connected by other interfaces, such as a parallel port, an IEEE 1394 serial port, a game port, a USB port, an IR interface, a BLUETOOTH® interface and/or the like.

A monitor 846 or other type of display device can be alternatively and/or additionally connected to the system bus 808 via an interface, such as a video adapter 848. In addition to the monitor 846, a computer typically includes other peripheral output devices (not shown), such as speakers, printers and/or the like.

The computer 802 can operate in a networked environment using logical connections via wired and/or wireless communications to one or more remote computers, such as a remote computer(s) 850. The remote computer(s) 850 can be a workstation, a server computer, a router, a personal computer, portable computer, microprocessor-based entertainment appliance, a peer device and/or other common network node, and typically includes many or all of the elements described relative to the computer 802, although, for purposes of brevity, only a memory/storage device 852 is illustrated. Additionally, and/or alternatively, the computer 802 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 854 and/or larger networks, e.g., a wide area network (WAN) 856. LAN and WAN networking environments can be commonplace in offices and companies and can facilitate enterprise-wide computer networks, such as intranets, all of which can connect to a global communications network, e.g., the Internet.

When used in a LAN networking environment, the computer 802 can be connected to the local network 854 through a wired and/or wireless communication network interface or adapter 858. The adapter 858 can facilitate wired and/or wireless communication to the LAN 854, which can also include a wireless access point (AP) disposed thereon for communicating with the adapter 858 in a wireless mode.

When used in a WAN networking environment, the computer 802 can include a modem 860 and/or can be connected to a communications server on the WAN 856 via other means for establishing communications over the WAN 856, such as by way of the Internet. The modem 860, which can be internal and/or external and a wired and/or wireless device, can be connected to the system bus 808 via the input device interface 844. In a networked environment, program modules depicted relative to the computer 802 or portions thereof can be stored in the remote memory/storage device 852. The network connections shown are merely exemplary and one or more other means of establishing a communications link among the computers can be used.

When used in either a LAN or WAN networking environment, the computer 802 can access cloud storage systems or other network-based storage systems in addition to, and/or in place of, external storage devices 816 as described above, such as but not limited to, a network virtual machine providing one or more aspects of storage and/or processing of information. Generally, a connection between the computer 802 and a cloud storage system can be established over a LAN 854 or WAN 856 e.g., by the adapter 858 or modem 860, respectively. Upon connecting the computer 802 to an associated cloud storage system, the external storage interface 826 can, such as with the aid of the adapter 858 and/or modem 860, manage storage provided by the cloud storage system as it would other types of external storage. For instance, the external storage interface 826 can be configured to provide access to cloud storage sources as if those sources were physically connected to the computer 802.

The computer 802 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 9, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 950 described below with reference to FIG. 9, and/or with reference to the one or more functional abstraction layers (e.g., quantum software and/or the like) described below with reference to FIG. 10, to execute one or more operations in accordance with one or more embodiments described herein. For example, cloud computing environment 950 and/or one or more of the functional abstraction layers 1060, 1070, 1080 and/or 1090 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 800 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 800 can be employed to use hardware and/or software to solve problems that are highly technical in nature, that are not abstract and/or that cannot be performed as a set of mental acts by a human.

Referring now to details of one or more aspects illustrated at FIG. 9, the illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C and/or automobile computer system 954N can communicate. Although not illustrated in FIG. 9, cloud computing nodes 910 can further comprise a quantum platform (e.g., quantum computer, quantum hardware, quantum software and/or the like) with which local computing devices used by cloud consumers can communicate. Cloud computing nodes 910 can communicate with one another. They can be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that cloud computing nodes 910 and cloud computing environment 950 can communicate with any type of computerized device over any type of network and/or network addressable connection (e.g., using a web browser).

Referring now to details of one or more aspects illustrated at FIG. 10, a set 1000 of functional abstraction layers is shown, such as provided by cloud computing environment 950 (FIG. 9). One or more embodiments described herein can be associated with, such as accessible via, one or more functional abstraction layers described below with reference to FIG. 10 (e.g., hardware and software layer 1060, virtualization layer 1070, management layer 1080 and/or workloads layer 1090). It should be understood in advance that the components, layers and/or functions shown in FIG. 10 are intended to be illustrative only and embodiments described herein are not limited thereto. As depicted, the following layers and/or corresponding functions are provided:

Hardware and software layer 1060 can include hardware and software components. Examples of hardware components include: mainframes 1061; RISC (Reduced Instruction Set Computer) architecture-based servers 1062; servers 1063; blade servers 1064; storage devices 1065; and/or networks and/or networking components 1066. In one or more embodiments, software components can include network application server software 1067, quantum platform routing software 1068; and/or quantum software (not illustrated in FIG. 10).

Virtualization layer 1070 can provide an abstraction layer from which the following examples of virtual entities can be provided: virtual servers 1071; virtual storage 1072; virtual networks 1073, including virtual private networks; virtual applications and/or operating systems 1074; and/or virtual clients 1075.

In one example, management layer 1080 can provide the functions described below. Resource provisioning 1081 can provide dynamic procurement of computing resources and other resources that can be utilized to perform tasks within the cloud computing environment. Metering and Pricing 1082 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1083 can provide access to the cloud computing environment for consumers and system administrators. Service level management 1084 can provide cloud computing resource allocation and/or management such that required service levels are met. Service Level Agreement (SLA) planning and fulfillment 1085 can provide pre-arrangement for, and procurement of, cloud computing resources for which a future requirement is anticipated in accordance with an SLA.

Workloads layer 1090 can provide examples of functionality for which the cloud computing environment can be utilized. Non-limiting examples of workloads and functions which can be provided from this layer include: mapping and navigation 1091; software development and lifecycle management 1092; virtual classroom education delivery 1093; data analytics processing 1094; transaction processing 1095; and/or application transformation software 1096.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. One or more, if not all aspects of the one or more embodiments described herein can be practiced on stand-alone computers. In a distributed computing environment, program modules can be located in local and/or remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and/or techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A device, comprising:
   an interferometer device that detects an interference of two spectral sidebands; and
   a signal processing circuit that balances the two spectral sidebands to switch between different common mode noise resiliencies.

2. The device of claim 1, wherein the signal processing circuit also:
   detects at least one of a phase or an amplitude of a signal resulting from the interference of the two spectral sidebands.

3. The device of claim 1, wherein the interferometer device comprises:
   an IQ modulator that generates the two spectral sidebands using a local oscillator (LO) microwave signal and a pair of signals at a same intermediate frequency.

4. The device of claim 1, wherein the interferometer device comprises:
   a mixer that interferes the two spectral sidebands having been output or reflected from a device under test, including mixing the two spectral sidebands with a local oscillator (LO) microwave signal.

5. The device of claim 4, wherein the mixer down converts a signal, comprising the two spectral sidebands, from the device under test, and suppresses a common mode noise of phase or amplitude of the signal.

6. The device of claim 1, wherein the two spectral sidebands comprise a first sideband that has been at least partially absorbed or phase-shifted and reflected or transmitted by a test device and a second sideband that has been reflected off or transmitted by the test device without being absorbed or phase-shifted by the test device.

7. The device of claim 1, wherein the interferometer device receives the two spectral sidebands from a device under test, and wherein the device under test is a resonator.

8. The device of claim 1, wherein the interferometer device further comprises:
   a mixer that interferes the two spectral sidebands having been output or reflected by a resonator during measurement readout of a state of a qubit by the resonator.

9. A method, comprising:
   detecting, by a system operatively coupled to a processor, an interference of two spectral sidebands with an interferometer device; and
   balancing, by the system, the two spectral sidebands to switch between different common mode noise resiliencies.

10. The method of claim 9, further comprising:
    detecting, by the system, at least one of a phase or an amplitude of a signal resulting from an interference of the two spectral sidebands.

11. The method of claim 9, further comprising:
    generating, by the system, a pair of signals at a same intermediate frequency; and
    mixing, by the system, the pair of signals with the first portion of the LO signal to generate the two spectral sidebands.

12. The method of claim 9, further comprising:
    interfering two spectral sidebands having been transmitted by or reflected off a device under test, including mixing the two spectral sidebands with a local oscillator (LO) microwave signal.

13. The method of claim 12, further comprising:
    down converting, by the system, a signal, comprising the two spectral sidebands, from the device under test; and
    suppressing, by the system, a common mode noise of phase or amplitude of the signal.

14. The method of claim 9, further comprising:
generating, by the system, a first portion and a second portion of a local oscillator (LO) microwave signal.

15. The method of claim 9, further comprising:
determining, by the system, a measurable state of a device under test based on an interfered signal output resulting from a mixing of the two spectral sidebands.

16. The method of claim 15, wherein the device under test is a resonator of a qubit measurement readout circuit.

17. The method of claim 16, wherein the measurable state is determined during measurement readout of a state of a qubit by the resonator.

18. A system, comprising:
a processor;
a chip controlled by the processor; and
an interferometer device coupled to the chip, wherein the interferometer device detects an interference of two spectral sidebands, wherein the interferometer device is configured to interfere the two spectral sidebands in response to measurement readout of a state of a qubit by the resonator, wherein the two spectral sidebands are output or reflected from the resonator.

19. The system of claim 18, wherein the interferometer device comprises:
a signal circuit that detects at least one of a phase or an amplitude of a signal resulting from the interference of the two spectral sidebands.

20. The system of claim 18, wherein the interferometer device comprises:
an IQ modulator that generates the two sidebands using a local oscillator (LO) microwave signal and a pair of signals at a same intermediate frequency.

21. The system of claim 18, wherein the interferometer device comprises:
a mixer that interferes the two spectral sidebands having been transmitted by or reflected off a device under test, including mixing the two spectral sidebands with a local oscillator (LO) microwave signal.

22. The system of claim 18, wherein the mixer down converts a signal, comprising the two spectral sidebands, from the device under test and suppresses a common mode noise of phase or amplitude of the signal.

23. The system of claim 18, wherein the interferometer device comprises:
a local oscillator (LO) that generates a first portion and a second portion of an LO microwave signal.

24. The system of claim 18, wherein the interferometer device comprises:
a mixer that interferes the two spectral sidebands having been received from a resonator.

* * * * *